United States Patent

Bian

(10) Patent No.: US 9,362,495 B2
(45) Date of Patent: Jun. 7, 2016

(54) CONFINED RESISTANCE VARIABLE MEMORY CELLS AND METHODS

(71) Applicant: Micron Technology, Inc., Boise, ID (US)

(72) Inventor: Zailong Bian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/083,069

(22) Filed: Nov. 18, 2013

(65) Prior Publication Data

US 2014/0151629 A1 Jun. 5, 2014

Related U.S. Application Data

(62) Division of application No. 12/843,640, filed on Jul. 26, 2010, now Pat. No. 8,597,974.

(51) Int. Cl.
| | |
|---|---|
| H01L 29/04 | (2006.01) |
| H01L 47/00 | (2006.01) |
| H01L 45/00 | (2006.01) |
| H01C 1/02 | (2006.01) |
| H01C 7/13 | (2006.01) |
| H01C 17/06 | (2006.01) |

(52) U.S. Cl.
CPC .............. *H01L 45/1253* (2013.01); *H01C 1/02* (2013.01); *H01C 7/13* (2013.01); *H01C 17/06* (2013.01); *Y10T 29/49099* (2015.01)

(58) Field of Classification Search
CPC ...... H01L 45/1253; H01C 1/02; H01C 17/06; H01C 7/13
USPC .............................................. 257/4, E31.029
See application file for complete search history.

(56) References Cited

U.S. PATENT DOCUMENTS

| | | | |
|---|---|---|---|
| 5,789,277 A | 8/1998 | Zahorik et al. | |
| 6,831,330 B2 | 12/2004 | Harshfield | |
| 7,314,776 B2 * | 1/2008 | Johnson et al. | 438/95 |
| 7,718,989 B2 * | 5/2010 | Lai et al. | 257/2 |
| 2003/0193053 A1 * | 10/2003 | Gilton | 257/72 |
| 2006/0211165 A1 * | 9/2006 | Hwang et al. | 438/95 |
| 2008/0246116 A1 | 10/2008 | Mouttet | |
| 2008/0303014 A1 | 12/2008 | Goux et al. | |
| 2009/0029031 A1 | 1/2009 | Lowery | |
| 2009/0091971 A1 | 4/2009 | Dennison et al. | |
| 2009/0302297 A1 | 12/2009 | Park et al. | |
| 2009/0309087 A1 * | 12/2009 | Lung | 257/2 |
| 2010/0059729 A1 | 3/2010 | Hudgens | |

FOREIGN PATENT DOCUMENTS

KR 20080028544 A 4/2008

OTHER PUBLICATIONS

Matthew M. Ziegler, et al. "CMOS/Nano Co-Design for Crossbar-Based Molecular Electronic Systems". IEEE Transactions on Nanotechnology, vol. 2, No. 4, Dec. 2003. (14 pgs.).

* cited by examiner

*Primary Examiner* — Stephen W Smoot
*Assistant Examiner* — Vicki B Booker
(74) *Attorney, Agent, or Firm* — Brooks, Cameron & Huebsch, PLLC

(57) ABSTRACT

Methods, devices, and systems associated with resistance variable memory device structures can include a method of forming a confined resistance variable memory cell structure includes forming a resistance variable material such that a first unmodified portion of the resistance variable material contacts a bottom electrode and a second unmodified portion of the resistance variable material contacts a top electrode.

14 Claims, 6 Drawing Sheets

CONFINED RESISTANCE VARIABLE MEMORY CELLS AND METHODS

PRIORITY INFORMATION

This application is a Divisional of U.S. application Ser. No. 12/843,640, filed Jul. 26, 2010, the specification of which is incorporated herein by reference.

TECHNICAL FIELD

The present disclosure relates generally to semiconductor memory devices and methods, and more particularly, in one or more embodiments, to confined resistance variable memory cells and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, such as phase change random access memory (PCRAM) and resistive random access memory (RRAM), among others.

The phase change material of a PCRAM device may exist in an amorphous, higher resistance state, or a crystalline, lower resistance state. The resistance state of the PCRAM cell may be altered by applying sources of energy to the cell, such as current pulses or pulses of light, among other sources of energy. For example, the resistance state of the PCRAM cell may be altered by heating the cell with a programming current. This results in the PCRAM cell being programmed to a particular resistance state, which can correspond to a data state. PCRAM devices may also be configured to provide multi-level storage. That is, the memory device may have a plurality of discrete and identifiable states which allow for multi-bit storage in a single memory cell.

Among various phase change materials used for memory devices, one common type includes a phase change chalcogenide alloy such as a Germanium-Antimony-Tellurium (GST) material. The solid phases of GST can rapidly change from crystalline state to amorphous state or vise versa upon heating and cooling cycles. The amorphous GST has relatively higher electrical resistance while the crystalline GST has relatively lower electrical resistance.

One challenge in designing PCRAM cells is that some processing steps, such as chemical mechanical polishing (CMP), etching, and wet clean, among other processing steps, can modify the GST materials. These modifications can cause damage to the GST materials, such as oxidation, phase segregation, and composition shifts, among other damaging effects. Such damage can cause the GST material to not perform as desired when an electrode is in contact with modified GST material.

DETAILED DESCRIPTION

Figure 1A:
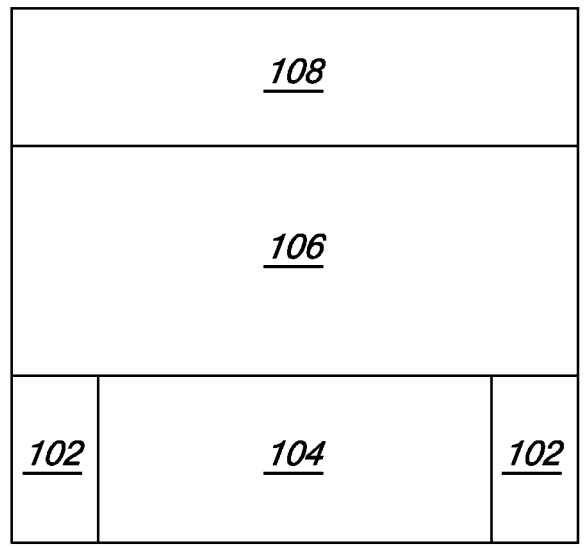
FIGS. 1A-1G illustrate process steps associated with forming a resistance variable memory cell in accordance with embodiments of the present disclosure.

Methods, devices, and systems associated with resistance variable memory device structures are described herein. In one or more embodiments, a method of forming a confined resistance variable memory cell structure includes forming a resistance variable material such that a first unmodified portion of the resistance variable material contacts a bottom electrode and a second unmodified portion of the resistance variable material contacts a top electrode.

One or more embodiments of the present disclosure can provide benefits such as reducing the programming and/or sensing currents, such as a reset current, for the memory cell, among other benefits. For instance, one or more embodiments can provide the ability to form the memory cell by mitigating the adverse effects of the modified resistance variable material. Therefore, the properties of the resistance variable material are changed during process, but the cell is constructed in a way such that the cell can function in an unaffected manner.

The term "substrate" or "substrate assembly" used in the following description may include, for example, a number of semiconductor-based materials that have an exposed semiconductor surface. Semiconductors can be understood to include silicon, silicon-on-insulator (SOD, silicon-on sapphire (SOS), doped, and undoped semiconductors, for example. In addition, semiconductors can be understood to include epitaxial portions of silicon supported by a base semiconductor foundation, among other structures. The base semiconductor foundation is typically the lowest portion of silicon material on a wafer or silicon deposited on another material.

The semiconductor need not be silicon-based. For example, the semiconductor can be silicon-germanium, germanium, or gallium-arsenide. When reference is made to "substrate" in the following description, previous process steps may have been utilized to create regions or junctions in or on the semiconductor. When reference is made to a substrate assembly, various process steps may have been previously used to form (e.g., define) various structures, such as regions, junctions, or features, and/or openings, such as capacitor plates or barriers for capacitors.

Embodiments of the present disclosure will now be described in detail with reference to the accompanying figures. It should be noted that although the figures illustrate only one memory cell, the semiconductor structures contemplated herein can have more than one memory cell.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 112 may reference element "12" in FIG. 1C, and a similar element may be referenced as 212 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIGS. 1A-1G illustrate process steps associated with forming a confined resistance variable memory cell structure in accordance with one or more embodiments of the present disclosure. The memory cell structure shown in FIGS. 1A-1G includes a bottom electrode 104 formed in a dielectric material 102. The bottom electrode 104 can be formed over a conductive contact. Although not shown in FIGS. 1A-1G, the conductive contact can be coupled to an access device (e.g., an access transistor) corresponding to a particular memory cell (e.g., a resistance variable memory cell such as a PCRAM cell or RRAM cell).

Also, the bottom electrode 104 can be formed over a base semiconductor structure that includes a substrate, not shown in FIGS. 1A-1G, and a conductive contact can be formed in a dielectric material over the substrate. The substrate can be a silicon substrate, silicon on insulator (SOI) substrate, or silicon on sapphire (SOS) substrate, among others. The dielectric material can be a nitride or oxide such as silicon dioxide ($SiO_2$), among other dielectric materials. The conductive contact can be made of tungsten (W) or other suitable conductive material and can be formed in the dielectric material via a masking and etching process, for instance. Bottom electrode 104 can be made of various conductive materials or composite structures including TiN (titanium nitride), TaN (tantalum nitride), copper, iridium, platinum, ruthenium, and/or tungsten, for example.

The structure can include a dielectric material 106 over the bottom electrode 104 and the dielectric material. A conductive material 108 can be formed over the dielectric material 106. The dielectric material 106 can be an oxide, such as silicon dioxide ($SiO_2$), among other oxides. The conductive material 108 can be a metal, such as tungsten (W) or titanium nitride (TiN), among other metals or metal compounds.

Figure 1B:
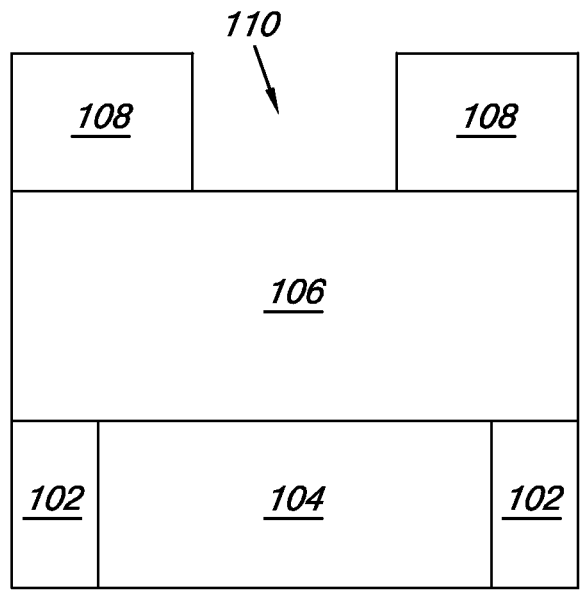
Figure 1C:
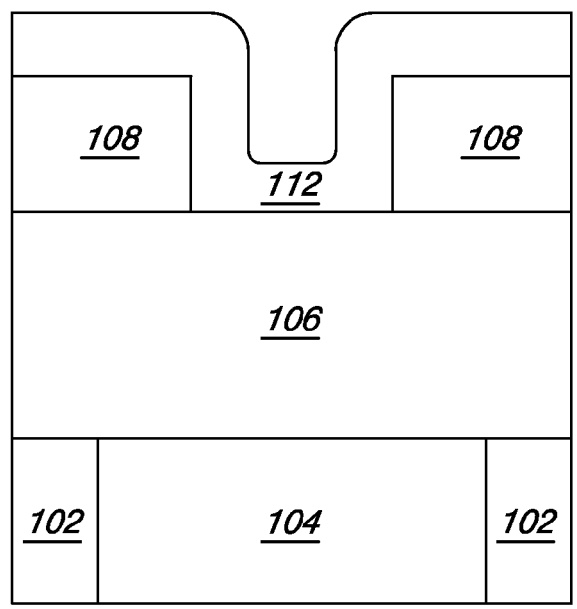

FIG. 1B illustrates a via 110 formed in the conductive material 108. The via 110 creates an opening in the conductive material 108 to expose a portion of the surface of the dielectric material 106. As shown in FIG. 1C, a conductive material 112 is conformally formed over the conductive material 108 and the dielectric material 106 in via 110. The conductive material 112 can be a metal, such as titanium nitride (TiN) or tungsten nitride (WN), among other metals or metal compounds. The conductive material 112 can be formed conformally using atomic layer deposition (ALD) or chemical vapor deposition (CVD), among other conformal process techniques.

Figure 1D:
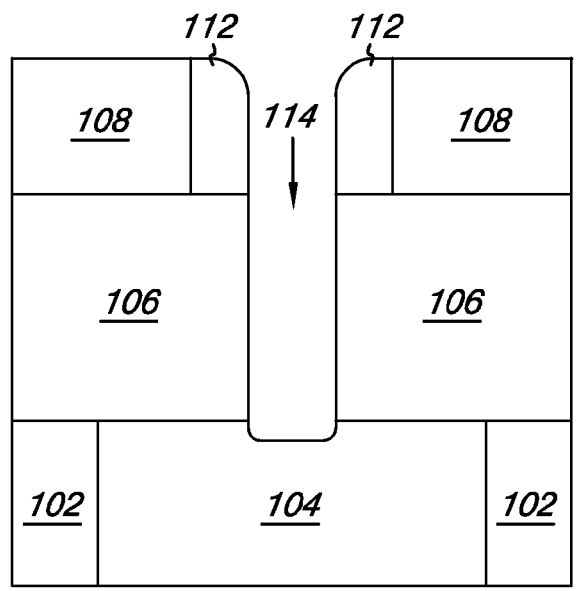

FIG. 1D illustrates a via 114 formed through the conductive material 112 and the dielectric material 106. The diameter of the via 114 is controlled by the thickness of the conductive material 112 formed on the sidewall of the conductive material 108. In one or more embodiments, the diameter of via 114 can be approximately 5 nanometers (nm) to 50 nm. Via 114 can be formed by dry etching through conductive material 112 and the dielectric material 106 to the bottom electrode 104. Via 114 can contact the surface of the bottom electrode 104 and/be etched some distance into the bottom electrode 104.

Figure 1E:
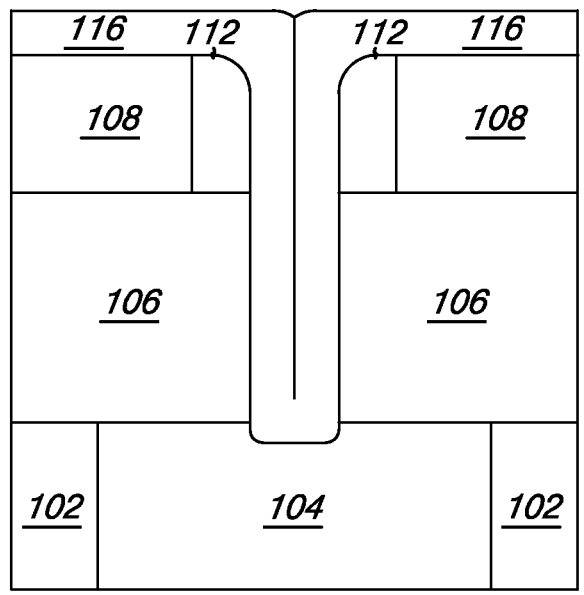

FIG. 1E illustrates a resistance variable material 116 formed in via 114. The resistance variable material 116 can be formed (e.g., deposited) in the via using ALD, CVD, or any other suitable deposition process. The resistance variable material 116 is formed over the bottom electrode 104 on the sidewalls of the dielectric material 106 and the conductive material 112 in via 114. In various embodiments, and as illustrated in FIG. 1E, the resistance variable material 116 can be deposited until the contact via 114 is filled with material 116. As one of ordinary skill in the art will appreciate, the structure illustrated in FIG. 1E can be further processed via chemical mechanical planarization (CMP), dry etching, and/or wet etching, among other material removing processes, such that the material 116 is confined within contact via 114 (e.g., the material 116 can be planarized to the surface of conductive material 112). The processing of the top surface of the resistance variable material 116 does not affect the portion of the resistance variable material in contact with the top electrode (e.g., conductive material 112) of the memory cell. The conductive material 112 acts as the top electrode for the memory cell and is contact with an unmodified portion of the resistance variable material 116. That is, since the conductive material 112 was formed prior to the deposition of the resistance variable material 116, the surface of the resistance variable material in contact with the conductive material 112 is unmodified.

Figure 1F:
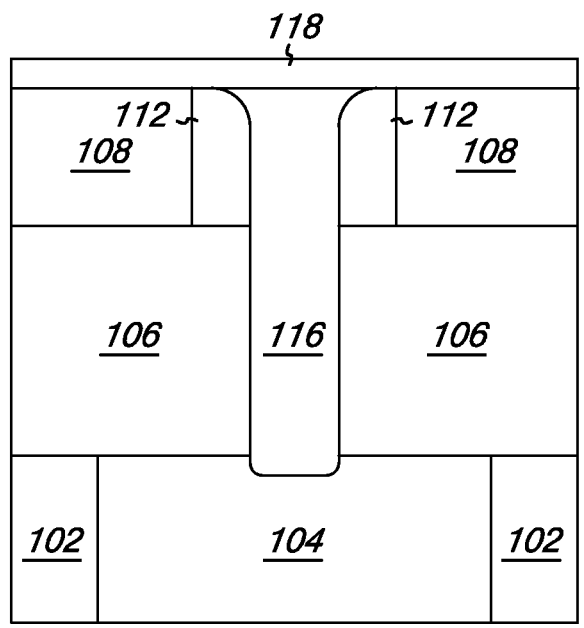

In FIG. 1F, a capping material 118 is formed over the resistance variable material 116, the conductive material 112, and the conductive material 108. The capping material 118 can protect the resistance variable material 116 from further process steps. The capping material 118 can be silicon dioxide ($SiO_2$) or silicon nitride (SiN), among other suitable capping materials.

Figure 1G:
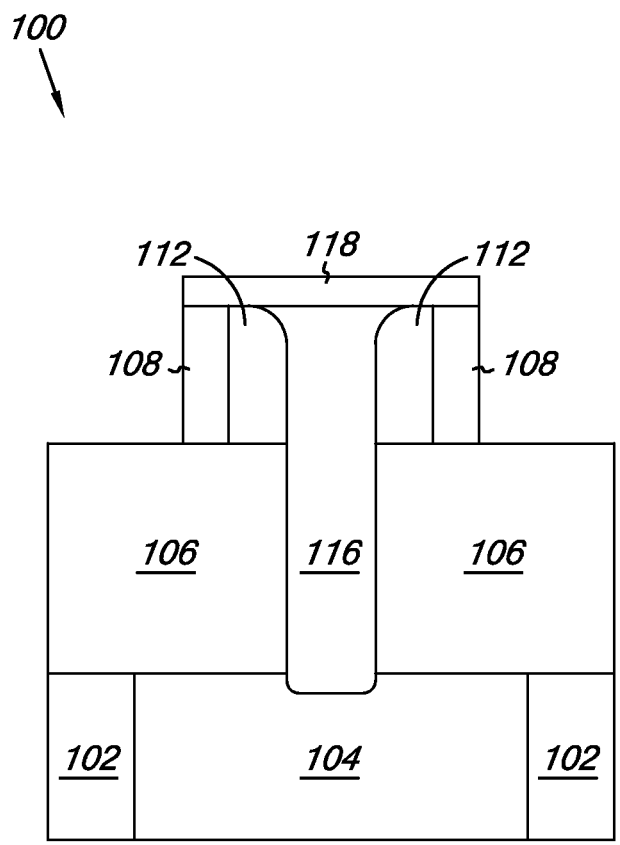

Once the capping material 118 is formed over the resistance variable material 116, the structure 100 can be isolated from other adjacent structures by etching through the capping material 118, the conductive material 112, and the conductive material 108 to the surface of the dielectric material 106 (as illustrated in FIG. 1G). This etching process will leave a portion the capping material 118, the conductive material 112 and the conductive material 108 to surround and protect the resistance variable material 116 of the structure 100.

One of ordinary skill in the art will also appreciate that an array of resistance variable memory cells would include a number of memory cell structures and additional memory components. For instance, a PCRAM and/or RRAM array could include access devices (e.g., access transistors) formed on a substrate. The bottom electrode 104 can be coupled to an access device (e.g., to a source or drain region of an access device via a contact plug) and the conductive material 112 can act as the top electrode for the memory cells. The top electrode 112 can be coupled to one or more bit lines (e.g., via contact plugs), for example, and the bit lines are conductive and can couple together a number of memory cell structures.

In one or more embodiments, the resistance variable material 116 can be a phase change chalcogenide alloy such as a Germanium-Antimony-Tellurium (GST) material (e.g., a Ge—Sb—Te material such as $GeSb_7Te_2$, $Ge_2Sb_2Te_5$, $Ge_1Sb_2Te_4$, $Ge_1Sb_2Te_5$, $Ge_1Sb_4Te_7$, etc.). The hyphenated chemical composition notation, as used herein, indicates the elements included in a particular mixture or compound, and is intended to represent all stoichiometries involving the indicated elements. Other phase change materials can include alloys of: Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—

Sb—Te, Ge—Te—Sn—Ni, Ge—Te—Sn—Pd, and Ge—Te—Sn—Pt, among various other phase change materials.

The memory cell structure of FIG. 1G can include resistance variable material 116 in contact with the top and bottom electrodes 112 and 104. The structure has been formed such that the portions of the resistance variable material 116 in contact with the top and bottom electrodes 112 and 104 that once deposited, has not been modified by further processing, such as CMP, etching, and/or wet cleaning, among other process steps. Process steps, such as CMP, etching, and/or wet cleaning, among other process steps can modify the resistance variable material by causing oxidation, phase segregation, and composition shifts, among other modifications in the resistance variable material. As such, the memory cell structure illustrated in FIG. 1G can have improved performance as compared to memory cells in which the contact surface of the resistance variable material has been modified. A memory cell structure that has modified resistance variable 116 contacting the top and/or bottom electrodes can affect the program and/or sensing currents for the memory cell, endurance (e.g., program/erase cycles), and retention. The unmodified resistance variable material/electrode contact in FIG. 1G can reduce the programming and/or sensing currents, such as a reset current, for the memory cell.

Figure 2:
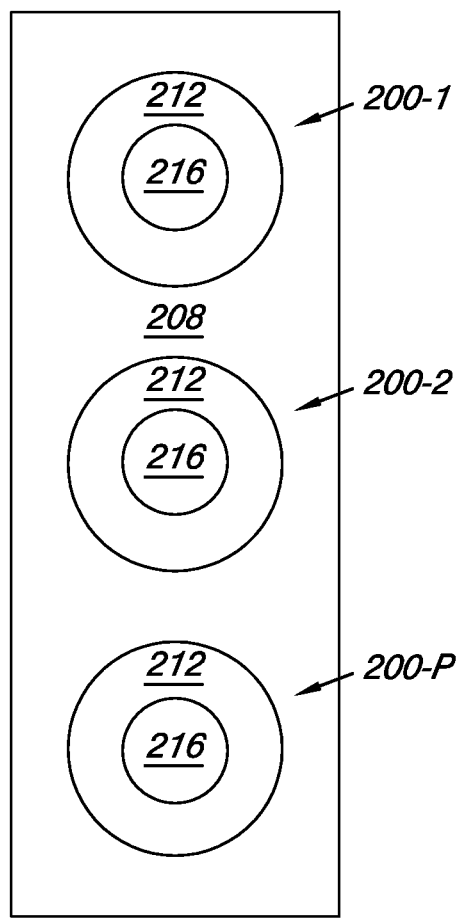
FIG. 2 illustrates a top view of a number of resistance variable memory cells formed in accordance with one or more embodiments of the present disclosure.

FIG. 2 illustrates a top view of a number of resistance variable memory cells formed in accordance with one or more embodiments of the present disclosure. In FIG. 2, a number of resistance variable memory cells 200-1, 200-2, and 200-P are shown. The capping material (e.g., capping material 118 as described above in association with FIGS. 1F-1G) is not shown in FIG. 2. The resistance variable memory cells 200-1, 200-2, and 200-P each include a resistance variable material 216 and conductive material 212. The conductive material 212 is in contact with the resistance variable material 216 and acts as the top electrode for each memory cell. Conductive material 208 can act as a bit line coupling each of the resistance variable memory cells 200-1, 200-2, and 200-P together.

The resistance variable memory cells 200-1, 200-2, and 200-P can include any number of memory cells coupled together and the memory cells 200-1, 200-2, and 200-P can be stacked and repeated in any desired configuration.

Figure 3:
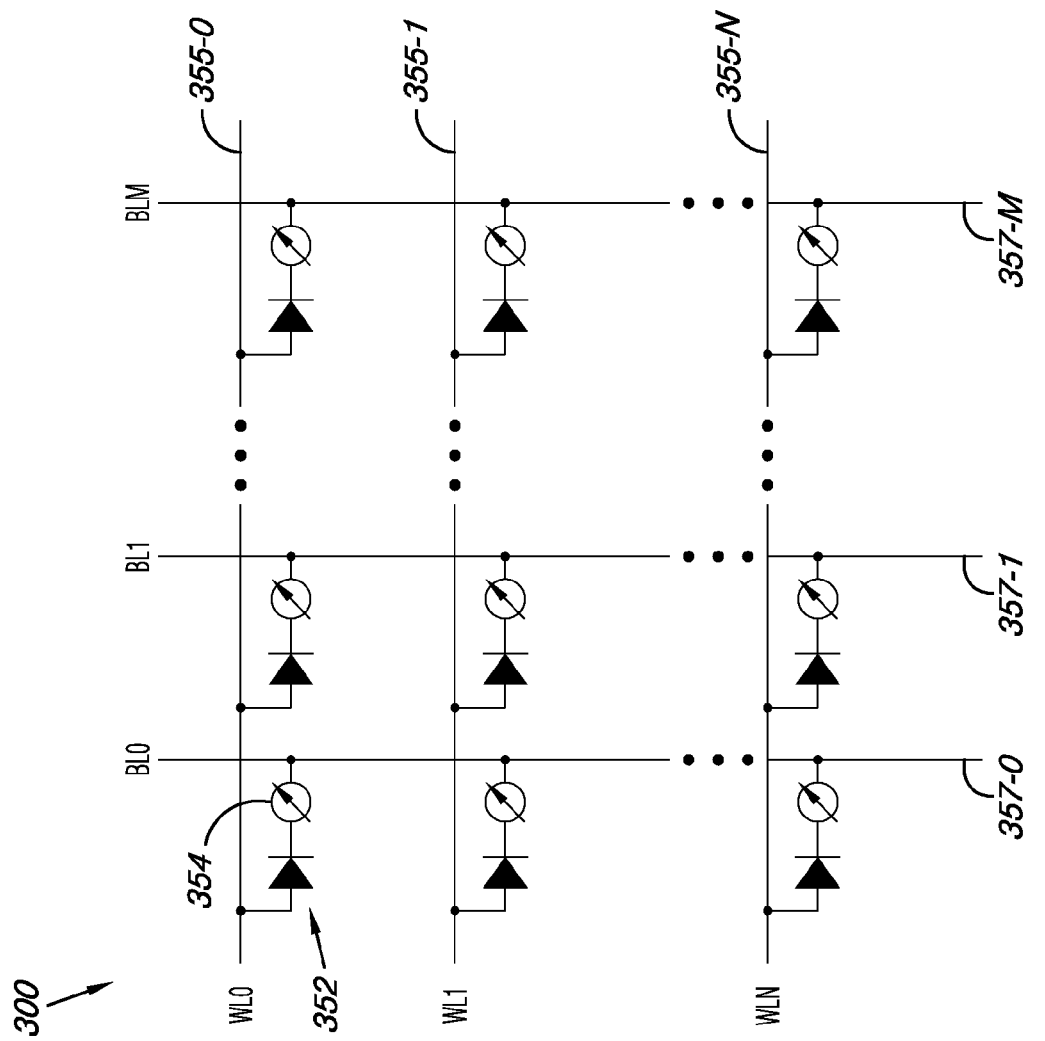
FIG. 3 is a schematic of a portion of a resistance variable memory array in accordance with embodiments of the present disclosure.

FIG. 3 is a schematic of a portion of a resistance variable memory array 300 in accordance with a number of embodiments of the present disclosure. Resistance variable memory array 300 includes a number of resistance variable memory cells each having an associated access device 352 and resistance variable memory structure 354. Resistance variable memory structures 354 can be structures processed in accordance with a number of embodiments of the present disclosure. For example, resistance variable memory structures 354 can be the structures illustrated in FIGS. 1E-1G, and 2.

Access devices 352 can be operated, e.g., turned on/off, to access the memory cells in order to perform operations such as programming, e.g., writing, and/or sensing, e.g., reading, operations on the memory cells. In the embodiment illustrated in FIG. 3, access devices 352 are diodes. Diodes can include, for example, p-n diodes, Zener diodes, and Schottky diodes. Alternatively, access devices 352 can be field effect transistors (FETs) or bipolar junction transistors (BJTs), for example. Embodiments of the present disclosure are not limited to a particular type of access device 352.

As shown in FIG. 3, each access device 352 associated with each memory cell is coupled to one of a number of access lines, such as word lines 355-0 (WL0), 355-1 (WL1), . . . , 355-N (WLN), e.g., each word line 355-0, 355-1, . . . , 355-N is coupled to a "row" of resistance variable memory cells. The designator "N" is used to indicate that a memory array can include a number of word lines. The use of the term "row" is not meant to imply a particular linear and/or horizontal orientation of the memory cells. Rather, a row can mean a number of memory cells coupled to a particular word line, regardless of the orientation of the memory cells. For example, a row can include a number of memory cells coupled to a particular word line in a staggered, non-linear orientation.

As shown in FIG. 3, each resistance variable memory structure 354 is coupled to one of a number of data lines, such as bit lines 357-0 (BL0), 357-1 (BL1), . . . , 357-M (BLM), e.g., each bit line 357-0, 357-1, . . . , 357-M is coupled to a "column" of resistance variable memory cells. The designator "M" is used to indicate that a memory array can include a number of bit lines. For ease of addressing in the digital environment, the number of word lines 355-1, . . . , 355-N and the number of bit lines 357-1, . . . , 357-M can each be some power of two, e.g., 256 word lines by 4,096 bit lines. However, embodiments are not limited to particular numbers of word lines and/or bit lines. Further, the use of the term "column" is not meant to imply a particular linear and/or vertical orientation of the memory cells. Rather, a column can mean a number of memory cells coupled to a particular bit line, regardless of the orientation of the memory cells. For example, a column can include a number of memory cells coupled to a particular bit line in a staggered, e.g., non-linear, fashion.

In operation, appropriate voltage and/or current signals, e.g., pulses, can be applied to bit lines 357-0, 357-1, . . . , 357-M and/or word lines 355-0, 355-1, . . . , 355-N in order to program data to and/or sense data from the resistance variable memory cells of resistance variable memory array 300. For example, during a programming operation, a current, e.g., a programming current, can be used to heat a heater electrode associated with resistance variable memory structures 354 to program the resistance variable memory cells, as previously described herein.

Embodiments of the present disclosure are not limited to resistance variable memory array 300 illustrated in FIG. 3. For example, a memory array can have an architecture other than that illustrated in FIG. 3, as will be understood by one of ordinary skill in the art. Further, as one of ordinary skill in the art will appreciate, resistance variable memory array 300 can be coupled to a controller, e.g., control circuitry, and/or programming and sensing circuitry (not shown in FIG. 3).

Methods, devices, and systems associated with resistance variable memory device structures are described herein. In one or more embodiments, a method of forming a confined resistance variable memory cell structure includes forming a resistance variable material such that a first unmodified portion of the resistance variable material contacts a bottom electrode and a second unmodified portion of the resistance variable material contacts a top electrode.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

It will be understood that, although the terms first, second, etc. may be used herein to describe various elements and that these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A confined resistance variable memory cell, comprising:
   a via in a structure that includes a bottom electrode, a top electrode, and a dielectric material between the bottom electrode and the top electrode, wherein the via is an opening in a first conductive material and a diameter of the via is controlled by a thickness of the first conductive material;
   a resistance variable material in the via, wherein the resistance variable material contacts the top electrode and the bottom electrode, wherein the top electrode includes the first conductive material that is in contact with a sidewall of a second conductive material, wherein the resistance variable material contacts a sidewall of the first conductive material of the top electrode, and wherein an upper surface of the top electrode is coplanar with an upper surface of the resistance variable material; and
   a capping material formed on the upper surface of the resistance variable material and the first and second conductive material.

2. The memory cell of claim 1, wherein the second conductive material coupled to the top electrode is a bit line for the memory cell.

3. The memory cell of claim 1, wherein the via is an opening in the dielectric material.

4. The memory cell of claim 1, wherein a first portion of the resistance variable material contacts the bottom electrode and a second portion of the resistance variable material contacts the top electrode.

5. The memory cell of claim 4, wherein the top electrode surrounds the second portion of the resistance variable material.

6. The memory cell of claim 1, wherein the structure includes a third conductive material coupled to the bottom electrode, and wherein the third conductive material coupled to the bottom electrode is coupled to an access device.

7. A confined resistance variable memory cell, comprising:
   a resistance variable material formed in a via, where the resistance variable material contacts a bottom electrode with a first portion of the resistance variable material and contacts a top electrode with a second portion of the resistance variable material, wherein the top electrode includes a first conductive material that is in contact with a sidewall of a second conductive material, wherein the resistance variable material contacts a sidewall of the first conductive material of the top electrode, wherein the via is an opening in the first conductive material and a diameter of the via is controlled by a thickness of the first conductive material, and wherein an upper surface of the top electrode is coplanar with an upper surface of the resistance variable material; and
   a capping material formed on the upper surface of the resistance variable material and the first and second conductive material.

8. The memory cell of claim 7, wherein the resistance variable material is confined in the via.

9. The memory cell of claim 7, wherein the second conductive material is coupled to the top electrode and the second conductive material is a bit line for the memory cell.

10. The memory cell of claim 7, wherein the top electrode surrounds the first portion of the resistance variable material that contacts the top electrode.

11. A confined resistance variable memory cell, comprising:
    a structure that includes a bottom electrode, a top electrode, and a dielectric material between the bottom electrode and the top electrode;
    a via in the structure, wherein the via is an opening in a first conductive material and a diameter of the via is controlled by a thickness of the first conductive material;
    a resistance variable material in the via, where a first portion of the resistance variable material contacts the bottom electrode and a second portion of the resistance variable material contacts the top electrode, wherein the top electrode includes a first conductive material that is in contact with a sidewall of a second conductive material, wherein the resistance variable material contacts a sidewall of the first conductive material of the top electrode, and wherein an upper surface of the top electrode is coplanar with an upper surface of the resistance variable material; and
    a capping material formed on the upper surface of the resistance variable material and the first and second conductive material.

12. The memory cell of claim 11, wherein the bottom electrode is formed over a base semiconductor structure that includes a substrate.

13. The memory cell of claim 11, wherein the memory cell is coupled to an access device.

14. The memory cell of claim 11, wherein the top electrode surrounds the second portion of the resistance variable material.

* * * * *